United States Patent [19]

Haas, sen. et al.

[11] Patent Number: 4,669,603

[45] Date of Patent: Jun. 2, 1987

[54] APPARATUS FOR SINGLING FILLED WAFER SLICES

[75] Inventors: Franz Haas, sen., Vienna; Franz Haas, jun., Leobendorf; Johann Haas, Klosterneuburg, all of Austria

[73] Assignee: Franz Haas Waffelmaschinen Industriegesellschaft m.b.H., Vienna, Austria

[21] Appl. No.: 700,549

[22] Filed: Feb. 11, 1985

[30] Foreign Application Priority Data

Feb. 20, 1984 [AT] Austria .................................. 559/84

[51] Int. Cl.⁴ ............................................. B65G 47/26
[52] U.S. Cl. .................................... 198/432; 198/459; 198/463.5
[58] Field of Search ............... 198/461, 459, 460, 624, 198/425, 432, 456, 463.3, 463.5; 271/110, 118, 121, 202, 270, 275, 277

[56] References Cited

U.S. PATENT DOCUMENTS

| | | | |
|---|---|---|---|
| 2,611,470 | 9/1952 | Rudolph | 198/461 |
| 3,273,691 | 9/1966 | Griner | 198/461 X |
| 3,290,974 | 12/1966 | Rowlands | 198/425 X |
| 3,602,358 | 8/1971 | Jakobsson | 198/461 X |
| 3,866,740 | 2/1975 | Greathead | 198/463.3 X |
| 4,228,888 | 10/1980 | Bruno | 198/461 |
| 4,372,438 | 2/1983 | Hyashi | 198/459 |

FOREIGN PATENT DOCUMENTS

| | | | |
|---|---|---|---|
| 969566 | 6/1975 | Canada | 198/459 |
| 37375 | 3/1977 | Japan | 198/459 |

Primary Examiner—Joseph E. Valenza
Assistant Examiner—Jonathan D. Holmes
Attorney, Agent, or Firm—Kurt Kelman

[57] ABSTRACT

When it is desired to single consecutive filled wafer slices, which are advanced with abutting trailing and leading faces, respectively, so that the singled wafer slices are ultimately spaced apart, a separation between consecutive wafer slices is to be effected in time even if the wafer slices are filled with cream so that their filling layers will strongly adhere to each other. This can be ensured in that a transfer device is provided between a feeding conveyor for advancing consecutive wafer slices abutting at their trailing and leading faces, respectively, and a delivering conveyor for advancing the rows of wafer slices on a delivery plane, which is vertically spaced from the feeding plane, on which the wafer slices are advanced by the feeding conveyor, and the transfer device pulls each leading wafer slice from the next succeeding wafer slice and moves the pulled-off wafer slice to the delivery plane.

7 Claims, 2 Drawing Figures

APPARATUS FOR SINGLING FILLED WAFER SLICES

BACKGROUND OF THE INVENTION

1. Field of the Invention

This invention relates to apparatus for singling filled wafer sheets which are consecutively advanced in one line or in a plurality of juxtaposed lines, wherein consecutive wafer slides adjoin and possibly adhere at their trailing and leading faces, respectively.

2. Description of the Prior Art

When it is desired to single consecutively advanced wafer slices which adjoin at their trailing and leading faces, respectively, so as to cause the wafer slices or transverse rows of such wafer slices to be spaced apart in the direction in which said wafer slices are advanced, it is known to separate consecutive wafer slices abutting at their trailing and leading edges, respectievly, in that said wafer slices are advanced by consecutive conveyor belts moving at different velocities and to provide between the conveyor belts a stop, which is lowered when the foremost wafer slice of the or each line is to be advanced from the slower conveyor belt onto the faster one so that said wafer slice or wafer slices are spaced apart from the next succeeding wafer slice in the or each line and, if the wafer slices are advanced in a plurality of juxtaposed lines, a new row of water slices is thus formed.

But that mode of separation will be effective only if the abutting wafer slices do not very strongly adhere to each other. If the filled wafer slices adhere rather strongly to each other, it will no longer be ensured that consecutive wafer slices will be separated in due time and in that case individual wafer slices will possibly be damaged by the stop as it returns to its initial position and the wafer slices advanced in a plurality of lines may not be properly aligned in the rows which have been formed.

SUMMARY OF THE INVENTION

It is an object of the invention to eliminate these disadvantages and to provide apparatus which ensures that consecutive wafer slices will be separated in time even if they adhere strongly to each other because they are filled with cream.

This object is accomplished in accordance with the invention in that a feeding conveyor is provided for advancing on a feeding plane consecutive wafer slices which abut at their trailing and leading faces, respectively, a delivering conveyor is provided for advancing said wafer slices on a delivery plane, which is vertically spaced from said feeding plane, and a transfer device is provided, which is disposed between the feeding and delivering conveyors and serves to separate the leading wafer slice of the or each line on said feeding plane from the next succeeding wafer slice on said feeding plane and to move the separated wafer slice to the delivering plane. Because a separate transfer device is provided and because the feeding plane and the delivering plane have a vertical spacing, which is bridged by the transfer device, the or each leading wafer slice will be reliably separated from the next succeeding wafer slice as the transfer device deflects the leading wafer slice out of the feeding plane and overcomes the adhesive forces between the filling materials of consecutive wafer slices. For this reason the invention permits a singling even of caramel-filled wafer slices.

In accordance with another feature of the invention, the delivering plane is spaced above the feeding plane and the transfer device comprises a lower pressure-applying device, which is adapted to be raised above the feeding plane and to pivotally move the or each leading wafer slice upwardly from the feeding plane and is adapted to be subsequently lowered, and also comprises an upper driving roller, which has a stationary axis and when the pressure-applying device has been raised engages the top of the or each leading wafer slice, wherein the rearwardly facing surface of the pressure-applying device constitutes a stop for engaging the or each next succeeding wafer slice. Owing to that arrangement the or each leading wafer slice is moved by the pressure-applying device toward the upper driving roller and is urged against the latter. As a result, the or each leading wafer slice is vertically displaced or pivotally moved in height from the next succeeding wafer slice so that any adhesion between the abutting faces of consecutive wafer slices will be eliminated. The stop formed by the pressure-applying device will present a premature advance of the or each next succeeding wafer slice so that the spacing of consecutive singled wafer slices can be controlled by the timing of the pressure-applying device.

In accordance with a further feature of the invention the pressure-applying device comprises a beam, which is adapted to be lifted and lowered and which has at its top a ramp surface, which rises in the direction of conveyance and is engageable by the underside of each wafer slice. That arrangement will afford the advantage that consecutive wafer slices will be subjected to a shearing movement at their interface and will be pivotally moved at the same time so that any filling layers adhering at the adjoining faces of the wafer slices will be reliably separated.

In accordance with a further feature of the invention the transfer device comprises a stationary stop, which closely succeeds the pressure-applying device and protrudes above the feeding plane but is disposed below the delivering plane, said stationary stop is engageable by the wafer slices on the feeding plane and the pressure-applying device is adapted to be raised above the stationary stop. This arrangement is particularly advantageous for handling short wafer slices.

A further feature of the invention resides in that the transfer device comprises a pair of accelerating rollers, which succeed the pressure-applying device and immediately precede the delivering conveyor and are adapted to engage the or each wafer slice at its top and bottom at the same time when said leading wafer slice has been moved out of the feeding plane by the pressure-applying device. Under the action of the pair of accelerating rollers a quickly increasing gap will be formed between the or each leading wafer slice and the next succeeding one.

DETAILED DESCRIPTION OF THE PREFERRED EMBODIMENTS

Figure 1:
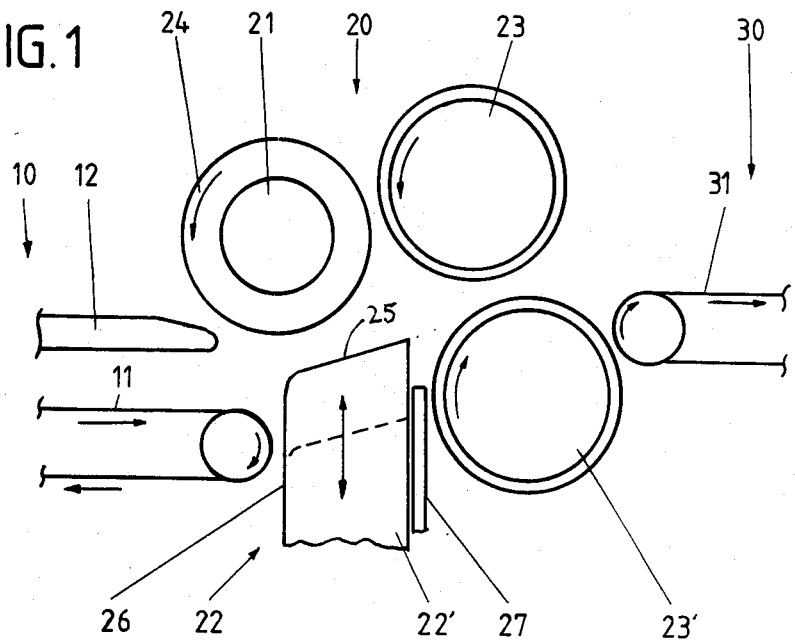
FIG. 1 is a side elevation showing diagrammatically a first embodiment.

Illustrative embodiments of the invention will now be described more in detail with reference to the drawing.

A singling apparatus in accordance with the invention comprises essentially a feeding conveyor 10, a transfer device 20 and a succeeding delivering conveyor 30. The feeding conveyor defines a feeding plane 11 and on that feeding plane 11 advance consecutive filled wafer slices, which abut at their trailing and leading faces, respectively, to the transfer device 20. The transfer device 20 engages each leading wafer slice and separates it from the next succeeding wafer slice and deposits said leading wafer slice onto the delivering conveyor 30 at a distance behind the next preceding wafer slice. The delivering conveyor 30 defines a delivery plane 31 and on said plane 31 advances the wafer slices in longitudinally spaced apart rows. The consecutive filled wafer slices may be fed in a single line; in that case each row on the delivering conveyor will consist only of one slice. If the wafer slices are fed in a plurality of juxtaposed lines, each transverse row will consist of wafer slices equal in number to the lines.

In the embodiment shown in FIG. 1, the delivery plane 31 defined by the delivering conveyor 30 extends above the feeding plane 11 defined by the feeding conveyor 10. The feeding conveyor 10 comprises a top guide 12, which is spaced above the top of the wafer slices lying on the feeding plane 11. The transfer device 20, which succeeds the feeding conveyor 10, comprises a driven upper driving roller 21, a pressure-applying device 22 disposed below said driving roller 21, and a pair of accelerating rollers 23, 23', which succeed the driving roller 21 and the pressure-applying device 22 and which are preferably provided each with an elastic covering. The accelerating rollers 23, 23' are succeeded by the delivering conveyor 30. The upper driving roller 21 is provided with an elastic covering 24, the lowermost generatrix of which is disposed below the underside of the top guide 12 of the feeding conveyor 10. The pressure-applying device 22 consists of a beam, which is adapted to be lifted and lowered and which is provided at its top with a ramp surface 25, which rises in the direction of advance and is engageable by the underside of each wafer slice. Rear end face 26 of the beam constitutes a stop for engaging the leading face of each wafer slice which immediately succeeds a leading wafer slice. The transfer device 20 also comprises a stationary stop 27, which is disposed between the pressure-applying device 22 and the lower accelerating roller 23' and which protrudes above the feeding plane 11. The beam of the pressure-applying device protrudes above the stationary stop 27 when said beam is in its upper position. If the wafer slices are fed in a plurality of lines, the feeding conveyor 10, the transfer device 20 and the delivering conveyor 30 extend across all said lines so that the leading wafer slices of all lines will simultaneously perform the movements described hereinbefore for the leading wafer slice.

The singling apparatus operates as follows: When the pressure-applying device 22 has been lowered, the filled wafer slices abutting at their adjacent trailing and leading faces are advanced by the feeding conveyor 10 into engagement with the stop 27 so that the wafer slices of the juxtaposed lines are aligned at the stop 27 and the leading wafer slices of all lines constitute a row of wafer slices engaging the stop 27. The pressure-applying device 22 is then raised to pivotally raise the leading wafer slice or the leading row of wafer slices at its leading face. As a result, the leading wafer slice of each row is pivotally moved by the beam 22' about the top rear edge of said wafer slice and is subsequently raised and urged against the upper driving roller 21. The thrust applied by the pressure-applying device 22 to each leading wafer slice thus imparts to said wafer slice a deflecting movement so that the filling material layers of the leading and next succeeding wafer slices adhering at their abutting trailing and leading faces will be torn apart because the next succeeding wafer slice is held down by the top guide 12 and is thus prevented from being pivotally moved together with the leading wafer slice. The elastic covering 24 of the upper driving roller 21 is compressed and said roller pulls each leading wafer slice from the next succeeding one and advances said leading wafer slice on the ramp surface of the beam 22' to the pair of accelerating rollers 23, 23', whereas the next succeeding wafer slice engages the rear face 26 of the pressure-applying device 22. As the upper driving roller 21 advances the wafer slice, the latter is engaged at its top and bottom by the pair of accelerating rollers 23, 23' at the same time and is accelerated by said rollers and advanced by them onto the delivering conveyor 30.

As soon as the pair of accelerating rollers have engaged the leading wafer slice, the pressure-applying device 22 is lowered and the next succeeding wafer slice is advanced by the feeding conveyor against the stop 27. When that next succeeding wafer slice has engaged the stop 27, the pressure-applying device 22 is raised so that that wafer slice is now urged against the upper driving roller etc.

In the embodiment shown in FIG. 1 the upper driving roller 21 may be driven to have a surface velocity which is as high as or slightly higher than the velocity of conveyance of the feeding conveyor 10 and the surface velocity of the accelerating rollers 23, 23' is distinctly higher.

Figure 2:
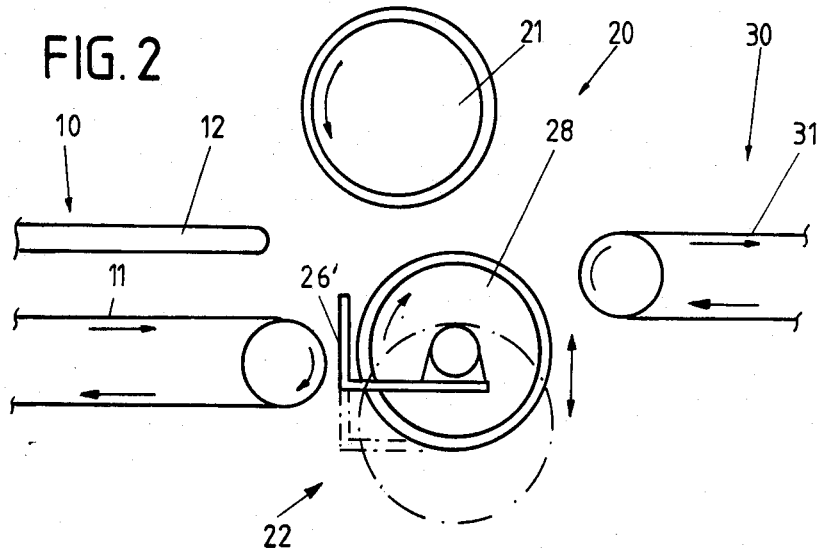
FIG. 2 is a side elevation showing a second embodiment of a singling apparatus.

The singling device shown in FIG. 2 differs from that shown in FIG. 1 in that the stop 27 and the accelerating rollers 23, 23' have been omitted and the pressure-applying device 22 comprises a stop flange 26' and a lower driven roller 28, which succeeds the stop flange 26' and protrudes above the latter. In this embodiment, the flange 26' of the raised pressure-applying device 22 protrudes above the feeding plane 11 so that each leading wafer slice will then be advanced against that flange 26 by the pressure-applying device 22. In this embodiment the pressure-applying device 22 is lowered first so that the leading wafer slice is first advanced by the feeding conveyor and is subsequently raised by the pressure-applying device in such a manner that the leading wafer slice is engaged by the lower roller 28 and urged upwardly against the upper driven roller 21 and is thus separated from the next succeeding wafer slice, as has been described in conjunction with the embodiment of FIG. 1. The two driven rollers 21 and 28 of the transfer device 20 rotate at a surface velocity which exceeds the velocity of advance on the feeding conveyor so that said rollers constitute also a pair of accelerating rollers, which determines the spacing of the singled rows of wafer slices.

When the lower driven roller 28 has been raised to urge each leading wafer slice against the upper driving rollers 21, the flange 26' of the transfer device 22 protrudes above the feeding plane 11 to constitute a stop for the next succeeding wafer slice. The next transfer cycle of the transfer device 22 is initiated in that the transfer device 22 is lowered to lower also that wafer slice which was previously the next succeeding wafer slice and is now the leading one.

We claim:

1. An apparatus for separating transverse rows of wafer slices conveyed in juxtaposed lines of consecutive wafer slices having trailing and leading faces adhering to each other to form transverse rows of wafer slices wherein the trailing and leading faces of consecutive wafer slices are spaced apart, which comprises
    (a) a feeding conveyor defining a feeding plane on which the transverse rows of the wafer slices are conveyed in juxtaposed lines of consecutive wafer slices having trailing and leading faces adhering to each other,
    (b) a top guide for the conveyed wafer slices above the feeding plane,
    (c) a delivering conveyor defining a delivery plane on which the wafer slices are conveyed in the transverse rows of wafer slices wherein the trailing and leading faces of consecutive wafer slices are spaced apart, the delivery plane being disposed above the feeding plane,
    (d) a driving roller disposed vertically stationarily between the feeding and delivering conveyors, the driving roller being disposed above the top guide, and
    (e) a pressure-applying device disposed between the feeding and delivering conveyors to receive the wafer slices from the feeding conveyor, the pressure-applying device being movable between a lower position wherein the device does not project above the feeding plane and an upper position wherein the device projects above the feeding plane and presses a respective one of the rows of wafer slices conveyed by the feeding conveyor onto the device against the driving roller, the pressure-applying device being arranged
        (1) to raise said one row of wafer slices during upward movement of the device from the lower to the upper position while the consecutive wafer slices are held by the top guide in the feeding plane whereby the adhering trailing faces of the wafers in said one row are separate from the leading faces of the consecutive wafer slices, and
        (2) to press said raised row of wafer slices whose trailing faces have been separated from the leading faces of the consecutive wafer slices on the feeding plane against the driving roller, the driving roller engaging the raised row of wafer slices and driving the wafer slices in the raised row onto the delivery plane.

2. The apparatus of claim 1, wherein the pressure-applying device is arranged to pivot the wafer slices in said row upwardly out of the feeding plane during the upward movement of the device until the raised row of wafer slices is engaged by the driving roller.

3. The apparatus of claim 1, wherein the pressure-applying device is arranged to lift the wafer slices in said row upwardly out of the feeding plane during the upward movement of the device until the raised row of wafer slices is engaged by the driving roller.

4. The apparatus of claim 1, further comprising a stop arranged vertically stationarily between the pressure-applying device and the delivering conveyor, the stop projecting above the feeding plane but below the delivery plane for stopping the one row of wafer slices conveyed by the feeding conveyor.

5. The apparatus of claim 1, wherein the pressure-applying device has an abutment facing the feeding conveyor and movable with the device, the abutment stopping the consecutive wafer slices in the feeding plane when the device has been moved to raise said one row of wafer slices.

6. The apparatus of claim 5, wherein the pressure-applying device is a vertically reciprocable beam having an upper ramp surface rising from the abutment towards the delivery plane and receiving the one row of wafer slices from the feeding conveyor during the upward movement of the beam.

7. The apparatus of claim 6, wherein an end face of the beam facing the feeding conveyor constitutes the abutment.

* * * * *